US012800909B2

(12) United States Patent
Nefzi et al.

(10) Patent No.: US 12,800,909 B2
(45) Date of Patent: Nov. 17, 2026

(54) OPTICAL ELEMENT, OPTICAL ARRANGEMENT, AND METHOD FOR MANUFACTURING AN OPTICAL ELEMENT

(71) Applicant: Carl Zeiss SMT GmbH, Oberkochen (DE)

(72) Inventors: Marwene Nefzi, Ulm (DE); Stefan Hembacher, Bobingen (DE); Jens Kugler, Aalen (DE); Irina Schrezenmeier, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 522 days.

(21) Appl. No.: 18/166,899

(22) Filed: Feb. 9, 2023

(65) Prior Publication Data

US 2023/0185080 A1 Jun. 15, 2023

Related U.S. Application Data

(63) Continuation of application No. PCT/EP2021/072709, filed on Aug. 16, 2021.

(30) Foreign Application Priority Data

Aug. 26, 2020 (DE) ......................... 102020210769.6

(51) Int. Cl.
*G02B 26/08* (2006.01)
*G02B 26/00* (2006.01)
(Continued)

(52) U.S. Cl.
CPC ....... *G02B 26/0825* (2013.01); *G02B 26/004* (2013.01); *G03F 7/2008* (2013.01); *H01F 1/447* (2013.01)

(58) Field of Classification Search
CPC .. G02B 26/0825; G02B 26/004; G02B 26/06; G03F 7/2008; G03F 7/70258; G03F 7/70266; H01F 1/447
(Continued)

(56) References Cited

U.S. PATENT DOCUMENTS

2004/0036940 A1* 2/2004 Hazelton ............ G02B 26/0825 359/223.1
2004/0085613 A1* 5/2004 Lassar ..................... G02F 1/091 359/280
(Continued)

FOREIGN PATENT DOCUMENTS

CN 109407469 A 3/2019
DE 10 2012 212 953 A1 6/2013
(Continued)

OTHER PUBLICATIONS

Translation of International Search Report for corresponding PCT Appl No. PCT/EP2021/072709, dated Dec. 9, 2021.
(Continued)

*Primary Examiner* — Travis S Fissel
(74) *Attorney, Agent, or Firm* — Fish & Richardson P.C.

(57) ABSTRACT

An optical element comprises a substrate and an optical surface formed on the substrate. At least one fluid-tight sealed chamber is embedded in the substrate and has a rheological fluid introduced therein for deforming the optical surface. An optical arrangement, such as an EUV lithography system, comprises at least one optical element as described above and a field generating device for generating an electromagnetic field. The electromagnetic field can be a time-varying electromagnetic field. The electromagnetic field can be a magnetic field. The electromagnetic field passes through the at least one chamber which contains the
(Continued)

rheological fluid. A method for producing an optical element designed as described above is also provided.

2 Claims, 4 Drawing Sheets

(51) Int. Cl.
*G03F 7/20* (2006.01)
*H01F 1/44* (2006.01)

(58) Field of Classification Search
USPC .......................................................... 359/224.1
See application file for complete search history.

(56) References Cited

U.S. PATENT DOCUMENTS

| | | | | |
|---|---|---|---|---|
| 2006/0198422 | A1* | 9/2006 | Chopra | G02F 1/167 374/158 |
| 2008/0151399 | A1 | 6/2008 | Hammann | |
| 2012/0075732 | A1 | 3/2012 | Griffith et al. | |
| 2015/0043060 | A1 | 2/2015 | Huber et al. | |
| 2016/0266376 | A1* | 9/2016 | Nam | G02B 26/0825 |
| 2019/0339625 | A1 | 11/2019 | Zweeing et al. | |

FOREIGN PATENT DOCUMENTS

| | | | |
|---|---|---|---|
| DE | 10 2012 207 003 | A1 | 10/2013 |
| DE | 10 2015 223 980 | A1 | 10/2016 |
| DE | 10 2017 200 638 | A | 3/2017 |
| EP | 1376192 | A2 | 1/2004 |
| EP | 2258656 | A1 | 12/2010 |

OTHER PUBLICATIONS

International Preliminary Report on Patentability for corresponding PCT Appl No. PCT/EP2021/072709, dated Mar. 9, 2023.
German Office Action, with translation thereof, for corresponding DE Appl No. 102020210769.6, dated Mar. 25, 2021.

* cited by examiner

OPTICAL ELEMENT, OPTICAL ARRANGEMENT, AND METHOD FOR MANUFACTURING AN OPTICAL ELEMENT

CROSS-REFERENCE TO RELATED APPLICATIONS

The present application is a continuation of, and claims benefit under 35 USC 120 to, international application PCT/EP2021/072709, filed Aug. 16, 2021, which claims benefit under 35 USC 119 of German Application No. 10 2020 210 769.6, filed Aug. 26, 2020. The entire disclosure of these applications are incorporated by reference herein.

FIELD

The disclosure relates to an optical element which comprises a substrate and an optical surface formed on the substrate. The disclosure also relates to an optical arrangement, for example an EUV lithography apparatus, comprising at least one such optical element, and to a method for producing an optical element.

BACKGROUND

The practice of actively deforming the optical surface(s) of optical elements in order to minimize their wavefront aberrations is known. For this purpose, use can be made of actuators, for example in the form of piezo-actuators, which are attached to the substrate in contacting fashion. However, the joining techniques for connecting such actuators to the substrate, for example the adhesive technique, are problematic. Especially if adhesives are used, there may be shrinkage of volume of the adhesive, leading to unwanted deformation of the substrate. The wavefront deformations caused by changes in the adhesive volume (volume shrinkage) and the thermal expansion of adhesives are typically difficult to correct. It can therefore be desirable to use one or more actuators for the wavefront correction that need not be connected to the substrate.

DE 10 2012 207 003 A1 discloses an optical element comprising a substrate, a reflective coating, and at least one active layer containing a magnetostrictive material. An optical arrangement, for example an EUV lithography apparatus, comprises at least one such optical element and a field generating device for generating a magnetic field, such as a location-dependent magnetic field, in the at least one layer. To this end, the field generating device may comprise a plurality of electromagnets which are spaced apart from the optical element.

DE 10 2015 223 980 A1 describes an optical assembly comprising an optical component and a component mount. Arranged between the optical component and the component mount is a vibration damping device, which comprises a magnet and a magneto-rheological damping component, on which the magnet acts in order to adjust the damping of the damping component. The magneto-rheological damping component can be in the form of a magneto-rheological fluid accommodated in a fluid container, by which the optical component is supported on the component mount.

US 2019/0339625 A1 discloses an optical arrangement, such as a lithography system, comprising a first component, for example a support frame, and a second component, for example a mirror, movable relative to the first component. In order to bring about a dampening of the movement of the second component, a magneto-rheological or electro-rheological liquid can be introduced into an intermediate space which is located between the first component and the second component and optionally extends into a recess in the second component.

SUMMARY

The disclosure seeks to provide an optical element, an optical arrangement, and a method for producing an optical element, in which the optical surface of the optical element can be deformed without an actuator having to be connected to the substrate for this purpose.

According to a first aspect, the disclosure provides an optical element a substrate and an optical surface formed on the substrate. At least one fluid-tight (hermetically) closed-off or sealed chamber, optionally a plurality of such chambers, is embedded in the substrate. A rheological fluid is introduced into the chamber(s) in order to deform the optical surface. The chamber(s) are fully closed and fluid-tightly (hermetically) sealed off from the environment.

The disclosure proposes to embed a rheological fluid (typically a liquid) in the substrate of the optical element for deforming the optical surface. In the context of this application, a rheological fluid is understood to mean a fluid whose flow behavior can be controlled or changed reversibly and, in general, quickly by the action of an electric and/or magnetic field. In the event of the—contactless—action of an external field, the rheological fluid, more precisely the magneto-rheological particles, for example, within the fluid, transfers compressive forces to the substrate. This can result in shear forces on the substrate forming the carrier of the optical surface, and the latter can deform as desired as a result of the force effect.

The direction of the shear forces within the substrate can depend on the field direction of the field lines within the rheological fluid. If the field lines run substantially parallel to the optical surface, the pressure or shear forces can also act on the substrate substantially parallel to the optical surface. If the field lines in the rheological fluid run substantially perpendicularly to the optical surface of the optical element, the pressure or shear forces can also run substantially perpendicularly to the optical surface, that is to say substantially in the normal direction of the optical surface. However, generating a magnetic field aligned perpendicular to the optical surface with the aid of a coil arrangement can be challenging.

In an embodiment, the rheological fluid is a magneto-rheological fluid or an electro-rheological fluid.

As is generally customary, a magneto-rheological fluid is understood to be a suspension of magnetically polarizable particles (e.g., in the form of carbonyl iron powder) which are finely distributed or suspended in a carrier liquid. Upon application of an external magnetic field, the polarizable particles of a magneto-rheological fluid are arranged or aligned in such a way that internal forces arise within the substrate. Generally, the magneto-rheological fluid solidifies when an external magnetic field is applied and therefore can be well suited to transmitting a force to the substrate.

As an alternative to using magneto-rheological fluids or liquids whose properties change when an external magnetic field is applied, the rheological fluid can also be an electro-rheological fluid whose viscoelasticity or viscosity changes when an external electric field is applied, polyurethane particles dispersed in silicone oil being an example of such a fluid. Low-stiffness cables are possibly used to activate an electro-rheological fluid.

The assumption is made in the following description that the rheological fluid is a magneto-rheological fluid, but it goes without saying that what is the below in connection with the magneto-rheological fluid also applies analogously to electro-rheological fluids, etc.

In an embodiment, the substrate has a first partial body which is connected along a connecting surface to a second partial body on which the optical surface is formed, the at least one fluid-tight sealed chamber being adjacent to the connecting surface. In order to avoid potential issues that can occur when two components are connected using a joining agent, for example using an adhesive, it can be desirable for the two partial bodies to be connected without a joining agent. A type of connection for the two partial bodies is therefore bonding without a joining agent, as will be explained in more detail below.

The chamber embedded in the substrate can be formed entirely in the first partial body or in the second partial body. In this case, the connecting surface can form an upper or a lower chamber wall. However, it is also possible for the chamber to extend partially into the first partial body and partially into the second partial body. In this case, the chamber can be laterally adjacent to the connecting surface or the chamber intersects the connecting surface.

In a development, the at least one chamber forms a depression at least in the first partial body, the depression being adjacent to the connecting surface. The depression in the first partial body is covered by the surface of the second partial body when the two partial bodies are connected along the connecting surface. The second partial body can be placed on the first partial body like a lid and can be connected to the latter, with the chamber being embedded in the substrate. No connection is created between the first partial body and the second partial body in the region of a respective depression or chamber. The connection between the two partial bodies is produced by the connecting surface or by those sections of the connecting surface not associated with the chamber or chambers. Prior to connecting, the depression(s) is/are typically introduced into the first partial body and/or into the second partial body by mechanical processing, for example by grinding or milling.

In a development, the connecting surface forms a flat surface or a curved surface, which extends along a side of the second partial body which is remote from the optical surface. It was found to be advantageous if the second partial body, on which the optical surface is formed, has no recesses or projections, but this is not mandatory. Optionally, at least one depression may also be present in the second partial body if a corresponding chamber extends into the second partial body. The second partial body can be a substantially planar component, the optical surface being formed on one side thereof and the other side or surface thereof forming the connecting surface. The second partial body may have a substantially constant thickness for example, but this is not mandatory. For the connection of the two partial bodies, it can be desirable for the connecting surface to be flat, that is to say has no curvature, as this facilitates the connection of the two partial bodies, for example using a bonding connection (see below).

In an embodiment, the optical surface can be convexly preformed and, under the action of a field on the rheological fluid, the optical surface is deformable into a neutral initial state, for example a flat initial state, from which a bidirectional deformation of the optical surface is implemented. As a result of the action of a field, for example in the form of a magnetic field, on the rheological fluid, it is generally only possible to exert shear forces in one direction (i.e., only compressive forces) on the substrate. Accordingly, the optical surface can be actuated in one direction only. In the present embodiment, the optical surface can be polished during production of the optical element in such a way that the optical surface is preformed and an undeformed optical surface, for example a flat optical surface, is only formed once a field with a predetermined field strength acts on the rheological liquid. Since the undeformed geometry of the optical surface is only created once a field with a non-zero field strength acts on the rheological liquid, the optical surface can be deformed in both directions (bidirectional deformation) by reducing or increasing the field strength using the undeformed state as a starting point.

In the embodiment described above, the geometry of the optical surface generally deviates from the geometry of the flat or optionally curved surface which forms the connecting surface. In other words, the second partial body does not have a substantially constant thickness; rather, the thickness of the second partial body varies depending on the location in order to produce the pre-deformation of the optical surface.

In an embodiment, the substrate comprises at least one fluid-tightly sealed channel which connects the at least one fluid-tightly sealed chamber to a surface of the substrate arranged beyond the optical surface. Generally, the chamber is filled with the rheological fluid only after the chamber has been embedded in the substrate, that is to say only after the two partial bodies of the substrate have been connected. Generally, a respective channel connected to a chamber serves this purpose. The channel can have a comparatively small cross section in comparison with the chamber and only serves to supply the rheological fluid. After the supply, the channel, which for example may be a bore or the like, can be fluid-tightly (hermetically) sealed. To this end, the channel is typically filled with a material which enables fluid-tight sealing like a plug in order to avoid leakage. The material can be rubber, for example, for example FFKM (perfluoro rubber or perfluoroelastomer).

In an embodiment, the optical element comprises a reflective coating, such as for reflecting EUV radiation, applied to the substrate, the optical surface being formed on the reflective coating. In this case, the optical element can be a reflective optical element, for example in the form of a mirror. In this case, the optical surface can form the surface facing the surroundings of the reflective coating. The reflective coating may be designed to reflect EUV radiation with an operating wavelength in the EUV wavelength range between approx. 5 nm and approx. 30 nm. To this end, the reflective coating may have a plurality of alternating layers of a high refractive index and a low refractive index material, for example in the form of Mo/Si. However, the reflective coating can also be designed to reflect radiation from a different wavelength range, for example the VUV wavelength range.

In an embodiment, the a surface of the substrate remote from the optical surface has at least one recess that extends into the region of the chamber and serves for the insertion of a field generating device that acts on the rheological fluid. As described above, it is not necessary or generally advantageous for components of the field generating device to be connected to the substrate. However, it can be desirable for the back side of the substrate or first partial body to be designed in such a way that improved magnetic field guidance is possible. To this end, it can be desirable for at least one recess, in the form of a bore for example, which extends into the region of the chamber, to be formed in the first partial body of the substrate. Bars, such as designed magnets or other components of the field generating device, for example coils, can be inserted into this recess.

A further aspect of the disclosure relates to an optical arrangement, for example an EUV lithography system, comprising: at least one optical element embodied as described above; and a field generating device for generating an electromagnetic field, optionally a time-varying electromagnetic field, for example a magnetic field or electric field, which field passes through the at least one chamber into which the rheological fluid is introduced. The field generating device may comprise one or more electromagnets or permanent magnets in order to permeate a chamber with a magneto-rheological fluid. The field generating device may also comprise two or more electrodes, the potential of which is optionally adjustable with the aid of a voltage source, in order to permeate a chamber with an electro-rheological fluid.

The optical arrangement can be an EUV lithography system or an optical arrangement that is designed for a wavelength range other than EUV. The EUV lithography system can be an EUV lithography apparatus for exposing a wafer, or can be some other optical arrangement that uses EUV radiation, for example an EUV inspection system, for example for inspecting masks, wafers or the like that are used in EUV lithography.

In an embodiment, the field generating device for generating the magnetic field comprises at least one coil, optionally a plurality of coils or electromagnets. At least one coil is typically assigned to each chamber. The field generating device can be embodied to individually adjust the current intensity through the respective coil and hence the field strength of the magnetic field in the respective chamber. The stress in the magneto-rheological fluid and hence the force on the optical surface can change depending on the magnetic field strength. In this way, the compressive force that is exerted on the substrate by the respective fluid, a magneto-rheological fluid in this case, can be adjusted on an individual basis, with the result that a locally different deformation of the optical surface of the optical element can be set. However, it is also possible that the field generating device is embodied to generate a constant electromagnetic field, for example a constant magnetic field, which field cannot be changed during operation of the optical arrangement. To this end, the field generating device can have one or more permanent magnets.

In an embodiment, the at least one coil can have a horseshoe-shaped core which extends into the at least one recess in the substrate. In order to increase the forces that are exerted on the substrate in the case of an unchanging current through the coils, it was found that it can be advantageous if the magnetic field lines are impressed with the rheological liquid very close to the chamber. To achieve this, use can be made of, for example, a horseshoe-shaped or C-shaped core in the form of an iron core which extends into two recesses formed on opposite sides of a respective chamber. It goes without saying that the impressing of the magnetic field lines in the vicinity of a respective chamber can also be implemented in a different way.

In an embodiment, the field generating device comprises a plurality of permanent magnets arranged in a Halbach arrangement, the Halbach arrangement being inserted into the at least one recess in the substrate that extends into the region of the chamber and optionally enclosing the chamber in horseshoe-shaped (or C-shaped) fashion.

In this embodiment, a plurality of permanent magnets can be arranged in a Halbach arrangement around a respective chamber. A Halbach arrangement of permanent magnets can allow stray magnetic fields to be minimized by concentrating the magnetic flux on that side of the Halbach arrangement on which the optical element or the chamber is arranged. In the Halbach arrangement (Halbach array), a plurality of magnets or the respective magnetization direction can be in each case tilted against one another by 90° in the direction of the longitudinal axis of the array, as a result of which the magnetic flux can decrease on one side of the array and increases on the opposite side of the array.

In order to additionally suppress the magnetic fields directed away from the chamber, a shielding can be attached between the chamber remote side of the permanent magnets and the substrate, the shielding possibly made of (consisting of) a Mu-metal, for example, in order to shield the outside and any potential neighboring chambers from the magnetic field lines, and thus avoid interference. The geometry of the shielding can be matched to the geometry of the Halbach arrangement and can likewise be formed in a horseshoe-shaped or C-shaped manner.

The above-described embodiment can be in the form of a passively deformable optical unit which does not allow a change in the magnetic field over time without a replacement of the permanent magnets or the Halbach arrangement. Nevertheless, an individualized adjustment of the permanent magnets for a respective lithography apparatus or for a respective optical arrangement is possible. This individualization of the permanent magnets or the Halbach arrangement is also possible at a time after the apparatus has been delivered.

In a development of this embodiment, the Halbach arrangement forms the (iron) core of at least one coil. This embodiment can include a combination of permanent magnets and at least one coil with an iron core. In this case, the magnetic field can be predefined by the permanent magnets and can be varied over time by the at least one coil comprising an iron core by way of adapting the current flow through the coil.

In an embodiment, the optical arrangement comprises a control device for controlling the field generating device for adjusting the deformation, for example a location-dependent and optionally time-dependent deformation, of the optical surface. The control device may serve to solve the following and other problems that occur during the operation of the optical element in an optical arrangement, specifically an EUV lithography apparatus:

The control device can serve to actively or semi-actively adjust the deformation of the optical surface during or prior to operation of the optical arrangement, in order to minimize wavefront aberrations in the optical arrangement. In this case, the semi-active adjustment of the deformation can be implemented at defined time intervals for correcting wavefront aberrations that occur due to machine errors in the optical arrangement. The semi-active adjustment of the deformation can be implemented, for example, when the exposure is paused. The active control or adjustment is implemented during operation, for example during the exposure of the wafer or within the exposure time (usually continuously), in order to correct a dynamic behavior of the machine or the optical arrangement, and/or—in the case of a lithography apparatus—to compensate for wafer topology errors. In this case, for example, feedforward control can also be implemented on the basis of a measurement of the wafer topology errors.

Specifically, the adjustment of the deformation of the optical surface can be used to generate a predetermined 3-waviness which minimizes wavefront aberrations that arise on account of gravitational variations between the manufacturing site and the site of the end customer of the optical arrangement. A 3-point waviness on the optical surface can arise in the case of a 3-point mount of the optical element. The deformation to produce the desired 3-waviness is not necessarily implemented dynamically; rather, the generation of a static field with the aid of the field generating device may be sufficient.

The control device may also serve to generate an active or semi-active adjustment of a figure (surface shape) in the form of a so-called "not installed" (NEBL) differential figure. The NEBL differential figure may be used because the figure of optical elements is measured in a position different from the operational position and these optical elements are finally polished/coated in this position. The deviation or NEBL differential figure can be corrected when the optical element is installed in the optical arrangement, provided the size of the deviation is known. In order to determine the NEBL differential figure in the installed state, it is possible, for example, to measure the wavefront or the wavefront aberrations of the optical arrangement.

A further aspect of the disclosure relates to a method for producing an optical element, comprising the steps of: introducing a rheological fluid into the at least one chamber embedded in the substrate, optionally via at least one channel which connects the chamber to a surface of the substrate; and fluid-tightly closing off the at least one chamber into which the rheological fluid is introduced, optionally by sealing the channel. As described above, fluid-tightly closing off the at least one chamber can help avoid leakages. This can easily be implemented by virtue of a channel through which the rheological fluid is supplied to the chamber being sealed in a liquid-tight manner after the fluid has been supplied, the channel being in the form of a bore, for example.

In a variant, the first partial body of the substrate and the second partial body of the substrate are interconnected along the connecting surface for embedding the chamber in the substrate. The substrate material may be a glass or a glass ceramic. By way of example, the material of the substrate can be what is known as a zero-expansion material which has a very low coefficient of thermal expansion, for example titanium-doped fused silica (for example ULE®) or a glass ceramic (for example Zerodur).

In a further variant, the first partial body and the second partial body are connected along the connecting surface by fusion bonding, by silicate bonding, or by direct bonding. In the case of a connection by fusion bonding, the two partial bodies are typically heated to a temperature of more than approx. 800° C., with the result that the two partial bodies or their respective surfaces are melted along the connecting surface and the two partial bodies are interconnected along the connecting surface without the use of a joining agent. In the case of silicate bonding, the two partial bodies contain silicon (more precisely: $SiO_2$) as a constituent and their surfaces are temporarily dissolved using an alkaline liquid. The moisture can be removed again by heat treatment and a material connection is created. In the case of direct bonding, the surfaces can be activated and made hydrophilic using a plasma process, after which the surfaces can be contacted and connected by heat treatment (e.g., 120° C.-200° C.) under pressure in a vacuum. It is understood that the two partial bodies can also be interconnected by other types of bonding methods, with the use of a joining agent generally being dispensed with.

Further features of the disclosure will be apparent from the description of working examples of the disclosure that follows, with reference to the figures of the drawing, which show certain details of the disclosure, and from the claims. The individual features can each be implemented alone or in a plurality in any combination in one variant of the disclosure.

BRIEF DESCRIPTION OF THE DRAWINGS

Exemplary embodiments are depicted in the schematic drawings and are explained in the following description. In the drawings.

DETAILED DESCRIPTION

In the following description of the drawings, identical reference signs are used for identical or functionally identical components.

Figure 1A:
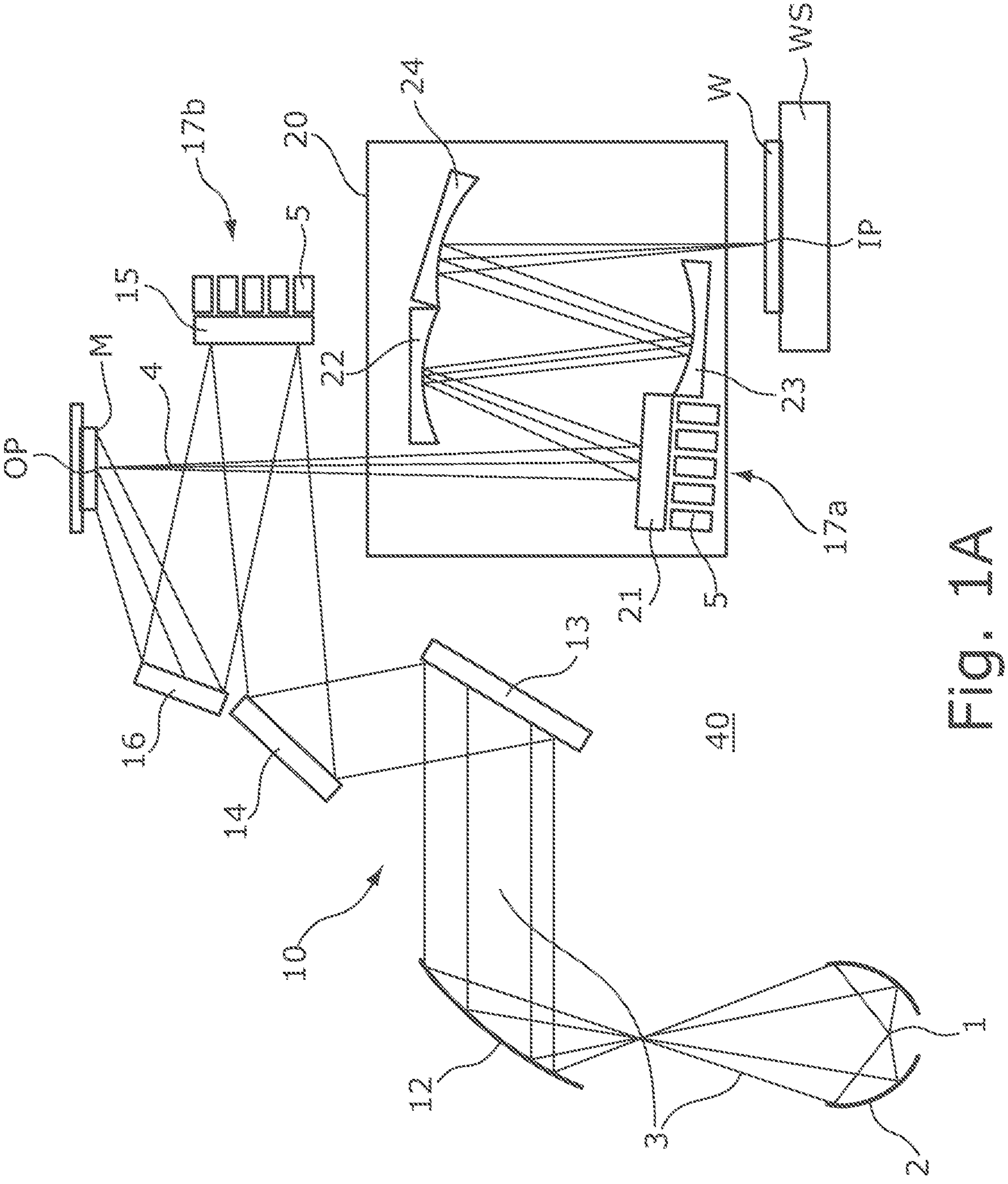
FIG. 1A shows a schematic representation of an EUV lithography apparatus comprising an illumination system and a projection lens.

An optical arrangement in the form of an EUV lithography apparatus 40 is shown schematically in FIG. 1A. It has an EUV light source 1 for generating EUV radiation, which has a high energy density in an EUV wavelength range below 50 nm, for example between approx. 5 nm and approx. 15 nm. The EUV light source 1 may for example take the form of a plasma light source for generating a laser-induced plasma or be formed as a synchrotron radiation source. In the former case, for example, a collector mirror 2 may be used, as shown in FIG. 1A, in order to focus the EUV radiation of the EUV light source 1 into an illumination beam 3 and in this way increase the energy density further. The illumination beam 3 serves for the illumination of a structured object M via an illumination system 10, which in the present example has four reflective optical elements 13 to 16.

The structured object M may be for example a reflective mask, which has reflective and non-reflective, or at least much less reflective, regions for producing at least one structure on the object M. Alternatively, the structured object M may be a plurality of micro-mirrors, which are arranged in a one-dimensional or multi-dimensional arrangement and which are possibly movable about at least one axis, in order to set the angle of incidence of the EUV radiation 3 on the respective mirror.

The structured object M reflects part of the illumination beam 3 and shapes a projection beam 4, which carries the information about the structure of the structured object M and is radiated into a projection lens 20, which generates an image of the structured object M or of a respective partial region thereof on a substrate W. The substrate W, for example a wafer, comprises a semiconductor material, for example silicon, and is disposed on a mounting, which is also referred to as a wafer stage WS.

In the present example, the projection lens 20 has four reflective optical elements 21 to 24 (mirrors) for generating an image of the structure that is present at the structured object M on the wafer W. The number of mirrors in a projection lens 20 typically lies between four and eight; however, only two mirrors may also possibly be used.

In order to achieve a high imaging quality in the imaging of a respective object point OP of the structured object M onto a respective image point IP on the wafer W, relatively stringent expected properties are to be made in respect of the surface shape of the reflective optical elements (mirrors) 21 to 24; and the position or the alignment of the optical elements 21 to 24 in relation to one another and in relation to the object M and the substrate W also involves precision in the nanometer range.

In order to respond to imaging aberrations within the projection lens 20, for example due to an incorrect alignment of the optical elements 21 to 24, due to manufacturing errors, and/or due to temperature-related deformations during operation, it is possible to counteract the unwanted deformation of the optical elements 21 to 24 via a first field generating device 17*a*, which typically comprises a plurality of electromagnets or coils 5 for generating a location-dependent variable magnetic field. FIG. 1A depicts the first field generating device 17*a* only in the region of the optical element 21 of the projection lens 20, but it is also possible to provide a respective field generating device for a plurality of optical elements 21 to 24 or even for all optical elements. In FIG. 1A, a second field generating device 17*b* with coils 5 is also arranged at the optical elements 13 to 16 of the illumination system 10, and so corrections can also be made in the illumination system 10.

Figure 1B:
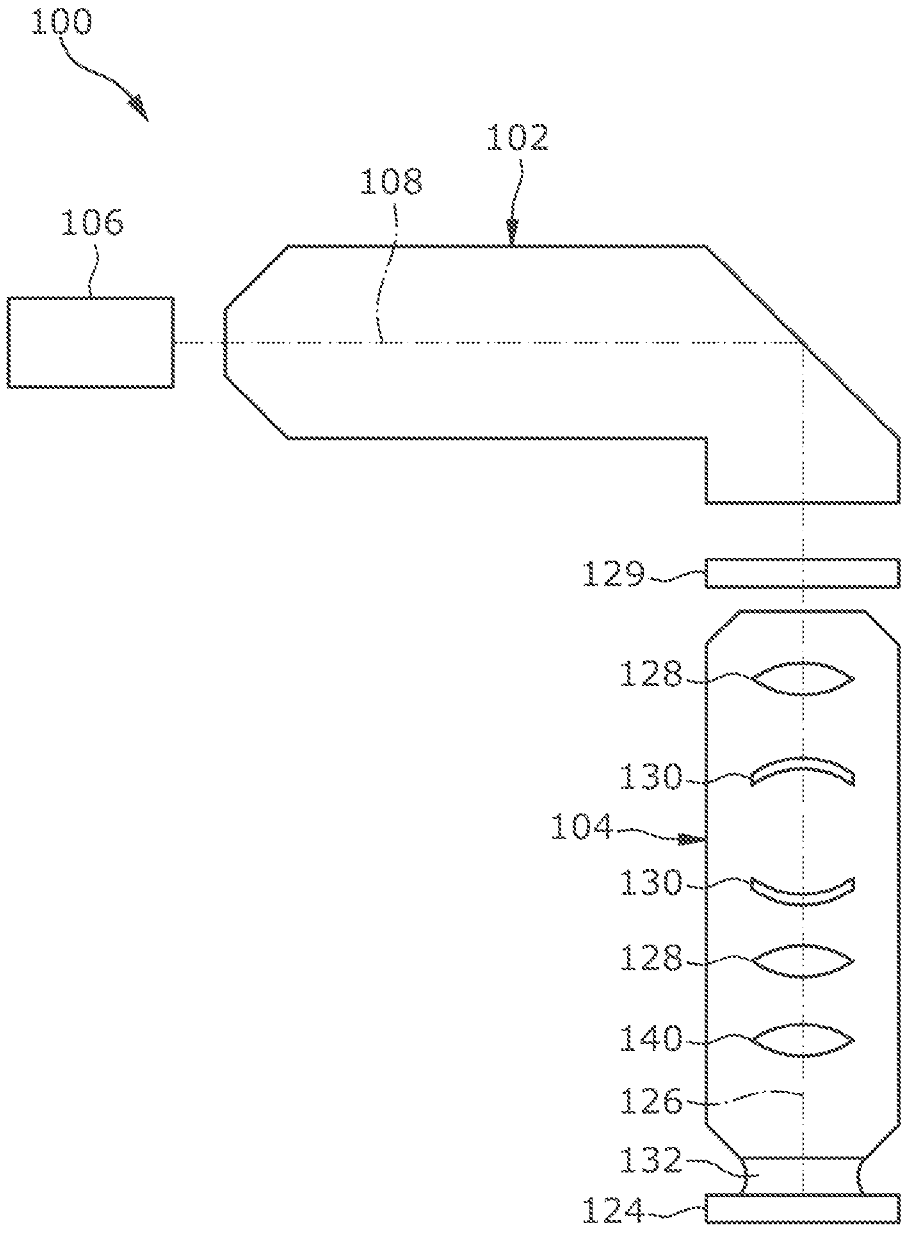
FIG. 1B shows a schematic representation of a DUV lithography apparatus comprising an illumination device and a projection lens.

FIG. 1B shows a schematic view of a DUV projection exposure apparatus 100, which comprises a beam shaping and illumination device 102 and a projection lens 104. In this case, DUV stands for "deep ultraviolet" and denotes a wavelength of the working light of between 30 nm and 370 nm. The DUV projection exposure apparatus 100 comprises a DUV light source 106. For example, an ArF excimer laser that emits radiation 108 in the DUV range at for example 193 nm, may be provided as the DUV light source 106.

The beam shaping and illumination device 102 illustrated in FIG. 1B guides the DUV radiation 108 onto a photomask 120. The photomask 120 is formed as a transmissive optical element and may be arranged outside the beam shaping and illumination device 102 and the projection lens 104. The photomask 120 has a structure of which a reduced image is projected onto a wafer 124 or the like via the projection lens 104.

The projection lens 104 has a number of lens elements 128, 140 and/or mirrors 130 for projecting an image of the photomask 120 onto the wafer 124. In this case, individual lens elements 128, 140 and/or mirrors 130 of the projection lens 104 may be arranged symmetrically in relation to the optical axis 126 of the projection lens 104. It should be noted that the number of lens elements and mirrors of the DUV projection exposure unit 100 is not restricted to the number shown. More or fewer lens elements and/or mirrors may also be provided. Furthermore, the mirrors are generally curved on their front side for beam shaping.

An air gap between the last lens element 140 and the wafer 124 may be replaced by a liquid medium 132 which has a refractive index of >1. The liquid medium 132 may be high-purity water, for example. Such a set-up is also referred to as immersion lithography and has an increased photolithographic resolution.

With the help of field generating devices (not depicted here) embodied analogously to the field generating devices 17*a,b* shown above in the context of FIG. 1A, it is also possible to correct undesired deformations of the lens elements 128, 140 and/or mirrors 130 of the projection lens 104 in the case of the DUV lithography apparatus 100 shown in FIG. 1B. The same applies to the optical elements of the beam shaping and illumination device 102.

FIGS. 2A-d show the structure of the first optical element 21 in the projection system 20 of the EUV lithography apparatus 40 from FIG. 1A in a schematic representation. The optical element 21 comprises a substrate 30 made of a material with a low coefficient of thermal expansion, for example Zerodur®, ULE® or Clearceram®, and a coating 31 that reflects the EUV radiation.

The reflective coating 31 has a number of layer pairs (not depicted here) with alternating layers made of a high refractive index layer material and a low refractive index layer material. As a result of the typically periodic structure of the reflective coating 31 (i.e., with pairs of layers of identical thickness), it is possible to reflect short-wavelength EUV radiation with a wavelength in the nm range (e.g., at 13.5 nm). In this case, the layers made of the high refractive index material are silicon and the layers made of the low refractive index material are molybdenum. Other material combinations such as molybdenum and beryllium, ruthenium and beryllium or lanthanum and $B_4C$, for example, are likewise possible.

Should the reflective optical element 21 be operated not in the EUV lithography apparatus 40 shown in FIG. 1A but with imaging light at wavelengths longer than 150 nm, for example in the DUV lithography apparatus 100 shown in FIG. 1B, then the reflective coating 31 generally likewise has a plurality of individual layers that consist of materials having different refractive indices in alternation. In this case, however, it may optionally also be possible to dispense with a multi-layer coating, that is to say the reflective coating may be formed from a single layer (e.g., made of aluminum) only.

An optical surface 32 on which the EUV radiation 3 is incident is formed on the upper side of the reflective coating 31 facing the surroundings. In order to change the optical properties of the optical element 21, more precisely in order to correct wavefront aberrations that arise during imaging with the projection lens 20, a plurality of fluid-tightly sealed chambers 33 are embedded in the substrate 30 and have introduced therein a magneto-rheological fluid 34 for deforming the optical surface 32, as will be described further below.

Figure 2A:
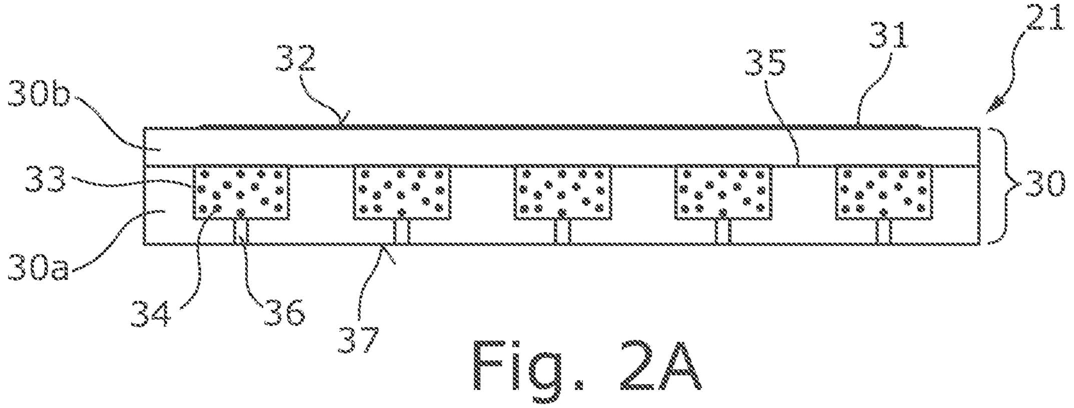
FIGS. 2A-2D show schematic sectional representations of an optical element in the form of an EUV mirror comprising a substrate in which magneto-rheological fluid filled chambers are embedded.
Figure 2B:
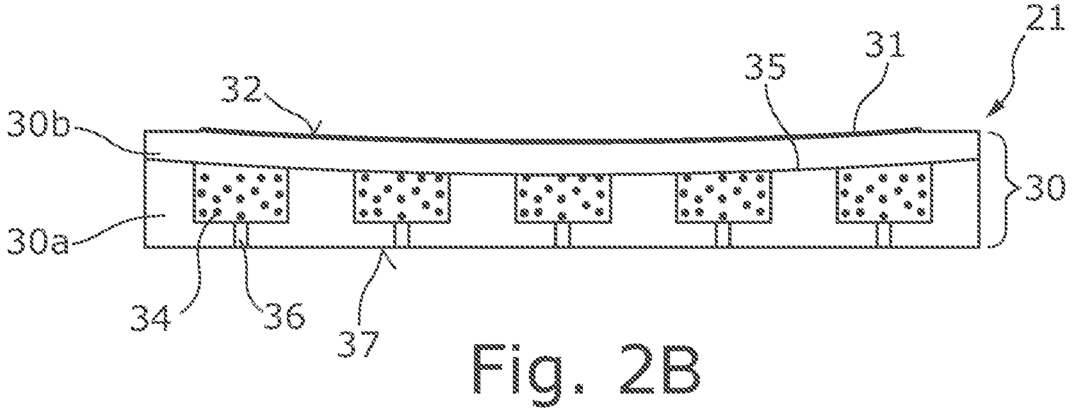
Figure 2C:
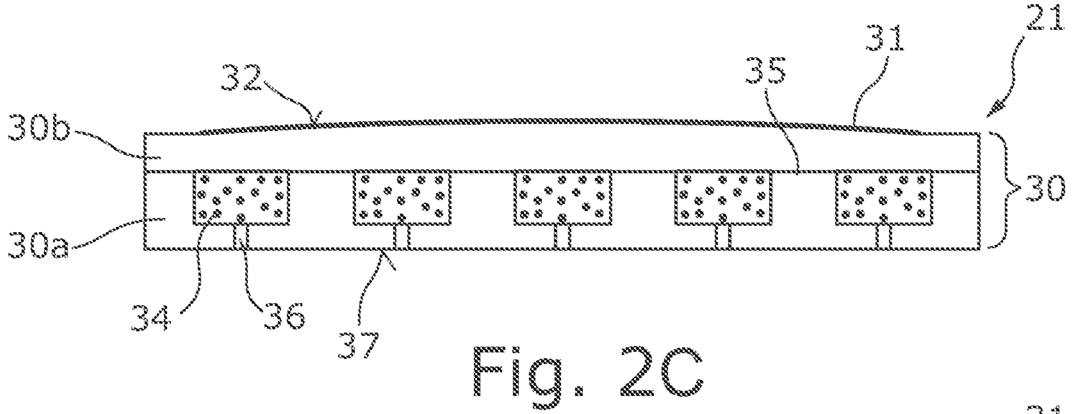

As is apparent from FIGS. 2A-d, the respective chamber 33 is completely filled with the magneto-rheological fluid 34. The total of five chambers 33 in FIGS. 2A-c is chosen in exemplary fashion, that is to say a greater or optionally a smaller number of chambers 33 may also be introduced into the substrate 30. The arrangement of the chambers 33 in the substrate 30 can be regular, that is to say a two-dimensional grid arrangement of chambers 33 can be formed in the substrate 30. However, an irregular arrangement of the chambers 33 in the substrate 30 is also possible. The lateral spacing of the chambers 33 and the width of the chambers 33 are determined on the basis of the spatial resolution with which the optical surface 32 is to be deformed. The width of the chambers 33 or their size may vary across the substrate 30, depending in each case on the locally desired spatial resolution. The height of the chambers 33 determines the area with which the magneto-rheological fluid 34 acts on the substrate and thus determines the force that is transmitted to the substrate 30 from the magneto-rheological fluid.

The substrate 30 comprises a first partial body 30*a* and a second partial body 30*b*, which are interconnected along a common connecting surface 35. A respective chamber 33 forms a cuboid depression in the first partial body 30*a* in the examples shown in FIGS. 2A-c. In the example shown in FIG. 2D, a cuboid depression is formed in each of the two partial bodies 30*a*, 30*b*, the cuboid depressions together forming the chamber 33. The depressions are formed by mechanical processing, for example by milling or grinding, in the material of the first partial body 30*a* or of the two partial bodies 30*a*, 30*b*. To form the substrate 30, the first partial body 30*a* provided with the depressions and the second partial body 30*b* optionally likewise provided with depressions are interconnected along a connecting surface 35 which extends outside of the chambers 33. The two partial bodies 30*a*, 30*b* are connected along the connecting surface 35 by a bonding process without the use of a joining agent. The bonding process can be, for example, fusion bonding, silicate bonding, or direct bonding.

Before or after the two partial bodies 30*a*, 30*b* are connected, bores 36 connecting a respective chamber 33 to a surface 37 of the first partial body 30*a* that forms the back side of the substrate 30 remote from the optical surface 32 are introduced in the first partial body 30*a*. The magneto-rheological fluid 34 is introduced or filled into the chamber 35 through the bores or channels 36. After the magneto-rheological fluid 34 has been filled, the channels 36 are fluid-tightly sealed, for example by being filled with rubber, for example FFKM, in order to close-off the channels 36 in the manner of a plug.

The three optical elements 21 shown in FIGS. 2A-d are each depicted with an undeformed optical surface 32, that is to say without a magnetic field being generated with the aid of the field generating device 17*b*. The optical elements 21 differ from one another in terms of the geometry or the surface shape of the optical surface 32: The optical element 21 shown in FIG. 2A has a flat optical surface 32 and the connecting surface 35 is likewise flat. The optical element 21 shown in FIG. 2B has a concavely curved undeformed surface 32 and the connecting surface 35 is likewise curved. In the optical elements 21 shown in FIGS. 2A,b, the thickness of the second, planar partial body 30*b* of the substrate 30 is therefore substantially constant. The first partial body 30*a* likewise has a constant, albeit greater thickness than the second partial body 30*b* on which the optical surface 32 is formed.

In the optical element 21 shown in FIG. 2C, the connecting surface 35 is flat like in the optical element 21 shown in FIG. 2A, but the optical surface 32 is convexly curved, with the result that the thickness of the second partial body 30*b* varies depending on the location. The optical surface 32 of the optical element 21 in FIG. 2C is preformed, that is to say it has a curvature that deviates from a flat geometry. The preformed optical surface 32 in FIG. 2C can be deformed into an undeformed, flat state via the field generating device 17*b*. The preforming of the optical surface 32 is advantageous since the magneto-rheological fluid 34 can be used only to introduce pressure or shear forces into the substrate 30 for deforming the optical surface 32. The preforming makes it possible to convert the optical surface 32 into a neutral, for example flat initial state by the application of a magnetic field 38 (cf. FIG. 3A), from which initial state the optical surface 32 can be deformed both in the positive and in the negative direction; that is to say it is possible to concavely or convexly deform the optical surface 32 by increasing or reducing the field strength of the magnetic field 38.

Figure 2D:
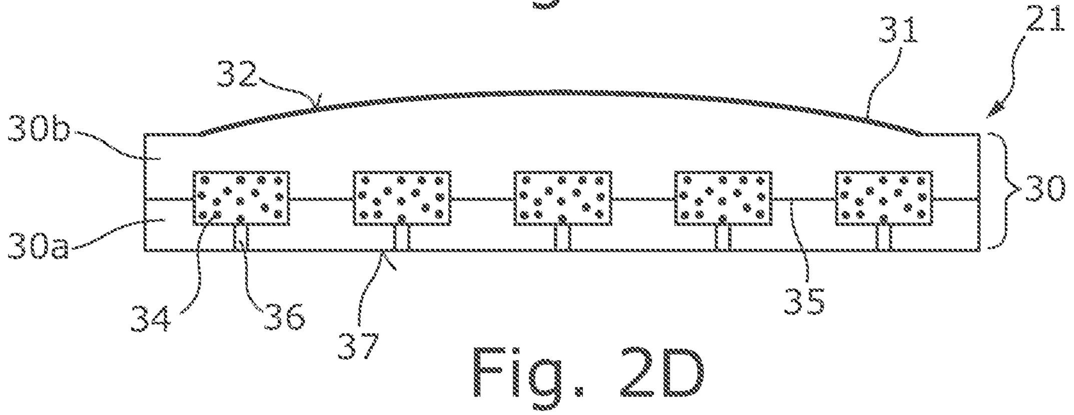

In the optical element 21 shown in FIG. 2D, the optical surface 32 likewise has convex curvature. Unlike what was described in FIG. 2C, the curved surface 32 of the optical element 21 in FIG. 2D has not been preformed in order to be converted into a neutral, for example flat state with the aid of the field generating device 17*b*. Instead, the curved surface 32 of the optical element 21 in FIG. 2D is a free-form surface which forms an initial state for a unidirectional deformation of the optical surface 32. Like the optical element 21 shown in FIG. 2C, the optical element 21 shown in FIG. 2D also has a second partial body 30*b* with a non-constant thickness.

Figure 3A:
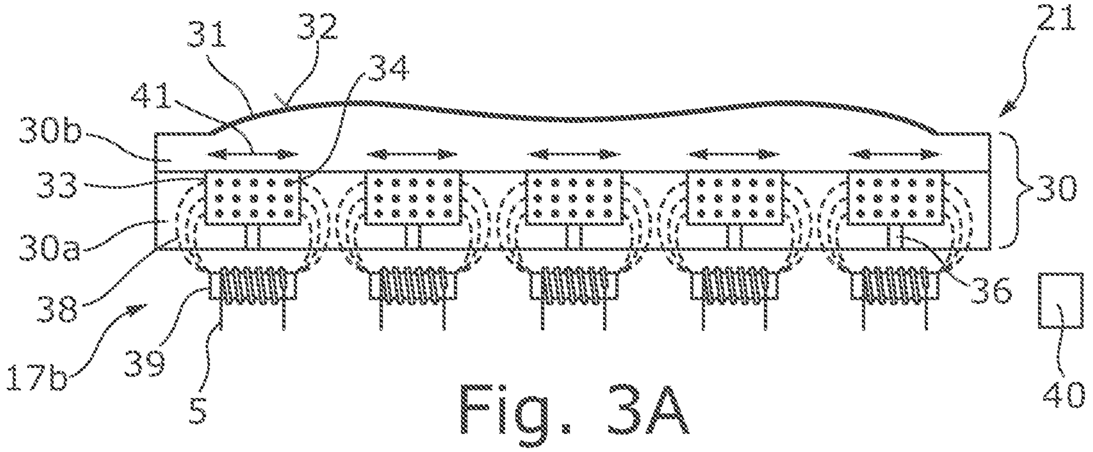
FIGS. 3A-3D show schematic representations of a field generating device for generating a magnetic field which passes through the chambers of the optical element in FIGS. 2A-2D in order to deform the optical surface of the latter.

FIG. 3A shows a detailed representation of the field generating device 17*b*, which is embodied to generate the magnetic field 38. The coils 5 each comprise an iron core 39 and form an electromagnet. The current through a respective coil 5 and hence the field strength of the magnetic field 38 which passes through a respective chamber 33 can be adjusted on an individual basis, that is to say individually for each coil 5, with the aid of a control device 40. As depicted in FIG. 3A by double-headed arrows 41, the penetration of the magneto-rheological fluid 34 with the magnetic field 38 leads to a shear stress on the substrate 30, which causes the section of the optical surface 32 located above the respective chamber 33 to deform, with the degree of deformation depending on the field strength of the magnetic field 38 in the respective chamber 33.

The deformation of the optical surface 32 with the aid of the field generating device 17*b* can, for example, be implemented semi-actively at predetermined time intervals in order to set a new, constant magnetic field and in this way minimize wavefront aberrations caused by machine errors, for example in order to set a figure of the optical surface 32. In the case of the semi-active deformation, the control device 40 can apply a time-varying current to the respective coil 5 during the respective adjustment, in order to generate a time-varying magnetic field 38. The semi-active adjustment of the deformation can be implemented, for example, when the exposure is paused.

For correcting a dynamic behavior of the EUV lithography apparatus 40, for example for compensating for wafer topology errors, there can also be an active, for example continuous control or adjustment of the deformation during the exposure of the wafer W (within the exposure time). In this case, for example, feedforward control can also be implemented on the basis of a measurement of the wafer topology errors.

However, a passive, temporally constant deformation of the optical surface 32 is also possible, with a current that is constant over time being generated by the field generating device 17*b*. A passive deformation is also possible if the field generating device 17*b* is not designed to adjust the strength of the magnetic field 38, for example if it only comprises permanent magnets.

Figure 3B:
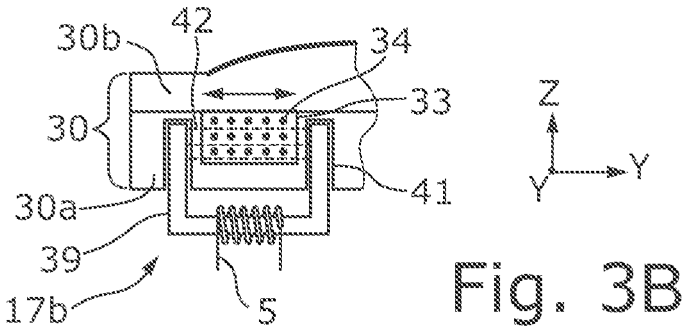

The efficiency of generating the magnetic field 38 can be increased if the magnetic field lines are impressed with the rheological liquid 34 very close to the respective chamber 33. For this purpose, a horseshoe-shaped iron core 39 is provided in the field generating device 17*b* shown in FIG. 3B, the horseshoe-shaped iron core extending into two recesses 41, which extend from the back side 37 of the substrate 30 into the region of the chamber 33, to be precise on opposite sides of the respective chamber 33. The horseshoe-shaped iron core 39 is used to generate a magnetic field with field lines 42 which run substantially parallel to the X-direction of an XYZ coordinate system, with the X-direction being aligned perpendicular to the thickness direction Z of the substrate 30. It goes without saying that the impressing of the magnetic field lines in the vicinity of a respective chamber 33 can also be implemented in a different way vis-à-vis the use a horseshoe-shaped iron core 39.

Figure 3C:
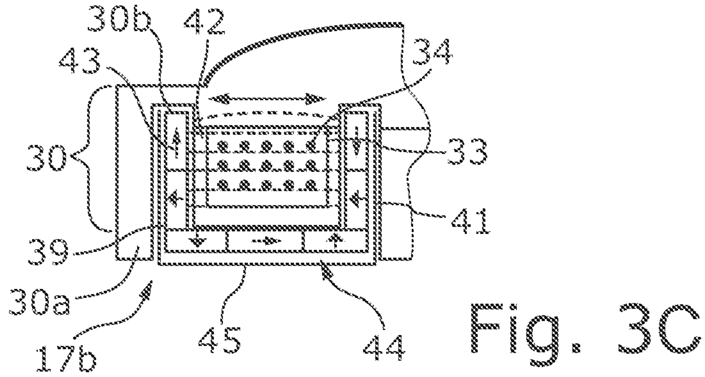

Such an example is depicted in FIG. 3C: In order to minimize stray magnetic fields, the field generating device 17*b* comprises a plurality of permanent magnets 43 arranged in a Halbach arrangement 44. Like the iron core 43 depicted in FIG. 3B, the Halbach arrangement 44 of the permanent magnets 43 is also formed in horseshoe-shaped (or C-shaped) fashion and is inserted into two recesses 41, which extend from the back side 37 of the substrate 30 into the region of the chamber 33, to be precise on opposite sides of the respective chamber 33. In the Halbach arrangement 44, the individual permanent magnets 43, in terms of their magnetization direction, are rotated through 90° with respect to one another, as a result of which improved guidance of the field lines 41 within the chamber 33 is realized.

A shielding 45, which in the example shown is formed from a Mu-metal and extends into the two recesses 41, is attached between the chamber 33 remote side of the permanent magnets 43 and the substrate 30. The shielding 45 serves to shield the outside and optionally adjacent chambers 33 in the substrate 30 from the field lines 41, in order thus to avoid interference. The shielding 45 is adapted to the geometry of the Halbach arrangement 44 and is likewise horseshoe-shaped or C-shaped in the example shown.

In the case of the Halbach arrangement 44 shown in FIG. 3C, the optical element 21 forms a passively deformable mirror, that is to say a constant, fixedly predetermined magnetic field is generated by the field generating device 17*b*. After measuring the optical arrangement, for example the optical arrangement of the EUV lithography system 40, in the field (or at the end customer), the desired surface figure of the optical element 21 can be adjusted via an individual set of permanent magnets 43 per chamber 33 in order to improve system performance. It goes without saying that such a purely passive deformation can also be implemented if the permanent magnets 43 are not arranged in a Halbach arrangement 44.

Figure 3D:
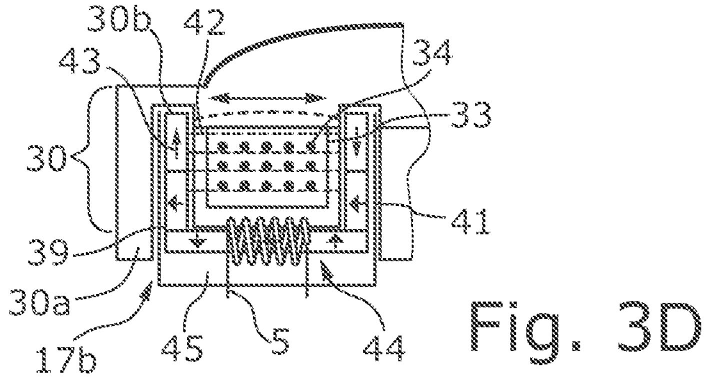

In the case of the example shown in FIG. 3D, the Halbach arrangement 44 comprising the permanent magnets 43 is combined with a coil 5 comprising an iron core, or the Halbach arrangement 44 forms the iron core of the coil 5. A combination of a plurality of coils 5 with the Halbach arrangement 44 is also possible. When the field generating device 17*b* is implemented in the manner shown in FIG. 3D, the permanent magnets 44 predefine the magnetic field and the at least one coil 5 comprising an iron core can change the magnetic field 38 in a time-variable manner by adapting the current flow through the coil 5. In the example shown in FIG. 3D, there is also a shielding 45 made of a Mu-metal in order to shield the outside from the magnetic field lines 41.

Although the examples above have been described in connection with a magneto-rheological fluid 34, other rheological fluids, for example electro-rheological fluids, can also be introduced into the respective chambers 33 in order to deform the optical surface 32 through the action of an electric field. In this case, the field generating device 17*b* is embodied to generate a time-constant or time-varying electric field. For this purpose, the field generating device 17*b* can comprise electrodes, for example in the form of two capacitor plates, which are each inserted in a cutout 41 and between which the chamber 33 is arranged. Instead of the flat or (spherically) concavely or convexly curved surface 32, (initially undeformed) aspheric surfaces or free-form surfaces 32 can naturally also be deformed in the manner described above in order to correct wavefront aberrations. It goes without saying that the optical surfaces 32 of optical elements not embodied to reflect EUV radiation can also be deformed in the manner described above.

What is claimed is:

1. An optical arrangement, comprising:

an optical element, comprising:

a substrate comprising a member selected from the group consisting of glass and a glass ceramic;

an optical surface supported by the substrate;

a fluid-tight sealed chamber embedded in the substrate; and a rheological fluid in the fluid-tight sealed chamber; and a field generating device configured to generate an electromagnetic field that passes through the chamber, wherein the field generating device comprises a plurality of permanent magnets disposed in a Halbach arrangement, and the Halbach arrangement is in a recess in the substrate.

2. The optical arrangement of claim 1, wherein the Halbach arrangement defines a core of a coil.

* * * * *